United States Patent [19]
Han

[11] Patent Number: 6,107,191
[45] Date of Patent: Aug. 22, 2000

[54] METHOD OF CREATING AN INTERCONNECT IN A SUBSTRATE AND SEMICONDUCTOR DEVICE EMPLOYING THE SAME

[75] Inventor: Jaeheon Han, Seoul, Rep. of Korea

[73] Assignee: Lucent Technologies Inc., Murray Hill, N.J.

[21] Appl. No.: 08/965,706

[22] Filed: Nov. 7, 1997

[51] Int. Cl.$^7$ ............................................. H01L 21/4763
[52] U.S. Cl. ...................... 438/637; 438/638; 438/740; 438/743; 438/744; 438/970; 216/17; 216/18; 216/41
[58] Field of Search .................... 438/637, 638, 438/740, 743, 744, 970; 216/17, 18, 41

[56] References Cited

U.S. PATENT DOCUMENTS

| | | | |
|---|---|---|---|
| 4,832,789 | 5/1989 | Cochran et al. | 156/644 |
| 5,635,423 | 6/1997 | Huang et al. | 437/195 |
| 5,891,799 | 4/1999 | Tsui | 438/624 |

FOREIGN PATENT DOCUMENTS

| | | | |
|---|---|---|---|
| PCT/US95/ 12194 | 9/1995 | WIPO | 21/768 |

*Primary Examiner*—John F. Niebling
*Assistant Examiner*—David A Zarneke

[57] ABSTRACT

The present invention is directed to methods of creating a cavity to contain an interconnect leading to a location within a substrate. The substrate has a first dielectric layer of a first etch rate over the location, and a semiconductor device containing the interconnect. One of the methods includes the steps of: forming a second dielectric layer on the first dielectric layer wherein the second dielectric layer has a second etch rate that is slower than the first etch rate, forming a photoresist layer on the second dielectric layer and etching into the first and second dielectric layers to form the cavity leading to the location. The second dielectric layer acts as a profile guiding layer to form a plug and runner simultaneously in a single etching step while controlling relative size of the plug and runner.

20 Claims, 4 Drawing Sheets

METHOD OF CREATING AN INTERCONNECT IN A SUBSTRATE AND SEMICONDUCTOR DEVICE EMPLOYING THE SAME

TECHNICAL FIELD OF THE INVENTION

The present invention is directed, in general, to wafer fabrication and, more specifically, to a method of creating an interconnect in a substrate and a semiconductor device employing the interconnect.

BACKGROUND OF THE INVENTION

As the complexity of integrated circuits increases, numerous approaches have been taken to solve the problem of expediently making electrical connection to and between individual devices. This is an important problem in integrated circuit fabrication because not only do electrical contacts and interconnections require space on the integrated circuit chip, but the complexity of the interconnections frequently requires the metallizations to be on more than one level. The former considerations require minimization of the size of the metallization, and the latter consideration introduces processing complexity.

In a typical multilevel fabrication sequence, windows or vias are first opened in a dielectric layer to expose selected portions of the underlying substrate and then filled with a metal. The substrate of the semiconductor may be used as an underlying material, and thus may include the silicon wafer, source and drain regions, prior interconnections, etc. Metal runners that form electrical connection to other portions of the semiconductor fill the windows that are formed on the dielectric. This is typically done by blanket depositing a metal and then patterning it. Of course, care must be taken to insure that the runners are properly aligned so that they contact the windows.

In such conventional processes, the metal is defined after the dielectric is deposited. Thus, there is a dielectric etch followed by the deposition and patterning of the metal. As the industry requirements for semiconductor sizes continue to decrease, a difficulty arises in that the metal patterning becomes very difficult to control. More specifically, the anisotropic etching of the metal may not be controlled very well. Moreover, this may become of particular concern as copper increasingly becomes the metal of choice over aluminum as the conductive metal. However, the use of copper presents a further problem in that it is harder to etch in a controlled manner.

Due to these problems, and as semiconductor sizes continue to decrease, forming a reliable interconnect structure with metal etching, whether copper or aluminum, has become difficult. In current processes, a photoresist is deposited over the metal in which the interconnect is to be formed, for example, see S. Wolf, *Silicon Processing for the VLSI Era*, Vols. I, II, and III, Latice Press, which are incorporated herein by reference. After patterning and exposure, the unexposed photoresist is removed and the etch continues to proceed into the underlying metal.

SUMMARY OF THE INVENTION

To address the above-discussed deficiencies of the prior art, the present invention provides methods of creating a cavity to contain an interconnect leading to a location within a substrate that has a first dielectric layer of a first etch rate formed over the location, and a semiconductor device containing such an interconnect. One embodiment of the method includes the steps of: forming a second dielectric layer on the first dielectric layer wherein the second dielectric layer has a second etch rate slower than the first etch rate, forming a photoresist layer on the second dielectric layer and etching into the first and second dielectric layers to form the cavity leading to the location.

The present invention therefore introduces the broad concept of varying the etch rate of adjacent dielectric layers to control the dimensions of a cavity to be formed beneath the layers.

In another embodiment, the method comprises the steps of forming a nitride layer on the oxide layer wherein the nitride layer has a second etch rate slower than the first etch rate, forming a photoresist layer on the nitride layer and etching into the oxide and nitride layers to form the cavity leading to the location.

In yet another embodiment, the present invention provides a semiconductor device comprising: a substrate having a conductive layer located therein, a first dielectric layer of a first etch rate located over a particular location on the conductive layer, a second dielectric layer located on the first dielectric layer, wherein the second dielectric layer has a second etch rate slower than the first etch rate, a photoresist layer located on the second dielectric layer, and a conductive substance deposited into a cavity in the first and second dielectric layers to form an interconnect leading to the particular location.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
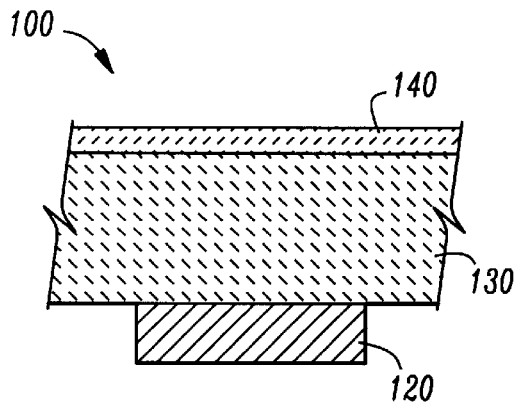
FIGS. 1A through 1G illustrate exemplary, schematic, cross-sectional views of an interconnect scheme, which are not drawn to, scale, used in constructing a semiconductor device according to the principles of the present invention.

Referring initially to FIGS. 1A through 1G, illustrated is a schematic, cross-sectional view of an interconnect scheme used in constructing a semiconductor device or structure 100 according to the principles of the present invention. Referring in particular to FIG. 1A, the semiconductor structure 100 consists of a previous interconnection level or a silicon-based substrate containing a conductive layer 120, which could be a metal conductor or doped region, respectively that is included in most semiconductor devices. While the substrate illustrated in this advantageous embodiment is composed of silicon, those skilled in the art will realize that the substrate may be composed of any semiconductor material, such as silicon, germanium or gallium arsenide or other materials suitable for manufacturing semiconductor devices for electronic applications. The semiconductor structure 100 further includes a first dielectric layer 130 having a first etch rate (i.e. the rate at which material is removed by etching) and located, in part, over the conductive layer 120. In one embodiment, the first dielectric layer 130 may be an oxide layer, which, in an advantageous embodiment, is composed of silicon oxide. A second dielectric layer 140 having a second etch rate slower than that of the first dielectric layer 130. Both dielectric layer 130 and 140 could be deposited by conventional deposition processes, such as Plasma Enhanced Chemical Vapor Deposition ("PECVD") or other methods. As explained below, the second dielectric layer 140 acts as a buffer or guiding layer between a subsequently deposited masking layer 180, such as a photoresist layer, and the first dielectric layer 130. In one embodiment, the second dielectric layer 140 may be a nitride layer. In an advantageous embodiment, however, the second dielectric layer 140 may be composed of silicon nitride, since silicon nitride can currently be produced with an etch rate of approximately four times slower than that of silicon oxide by using typical plasma oxide etch methods. As such, the slower etch rate of the second dielectric layer 140 allows it to be substantially thinner than the first dielectric layer 130. Assuming the etch selectivity of silicon nitride to photoresist is equivalent to or compatible with that of silicon dioxide to photoresist, the masking layer 180 may also be substantially thinner, which allows for more uniform exposure and patterning of the photoresist. Assuming that the etch rate of silicon nitride is four times slower than that of silicon oxide, the second dielectric layer 140, in an advantageous embodiment, may be one-fourth the depth of the first dielectric layer 130. The thinner second dielectric layer 140 improves the depth of focus and results in less photoresist scumming when conventional photolithography is used.

Those skilled in the art will realize that the use of any dielectric materials for the first and second dielectric layers 130, 140, in which the first etch rate exceeds the second etch rate, is within the scope of the present invention. In an advantageous embodiment, however, it is desirable that the etch rate of the second dielectric layer 140 be at least three times slower than the etch rate of the first dielectric layer 130.

Figure 1B:
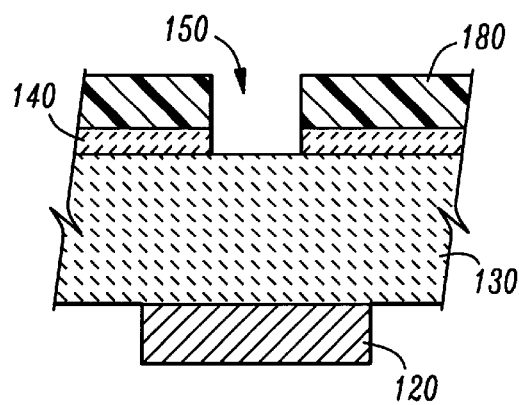

Referring now to FIG. 1B, a first etch proceeds as follows. The masking layer 180 is conventionally deposited over the second dielectric layer 140 and then patterned by exposure through a mask pattern (not shown). Patterning of the photoresist 180 and etching the second dielectric layer 140 define a first cavity 150 of sufficient width that subsequently defines a portion of a via that is later filled with a conductive material that contacts the underlying conductive layer portion 120 of the interconnect structure as the etching process proceeds (hereinafter referred to as "plug portion." This plug portion is the portion of the interconnect that is filled with a conductive material, such as metal, which contacts the underlying conductive layer 120. The mask pattern is thereby replicated in the second dielectric layer 140. As illustrated, the etch process is stopped at the interface of the first dielectric layer 130, as compared to conventional processes in which the etch proceeds immediately into the first dielectric layer. A gas-based sulfur hexaflouride ($SF_6$), silicon nitride anisotropic plasma etching process is used to selectively stop etch the second dielectric layer to the underlying silicon dioxide layer.

Figure 1C:
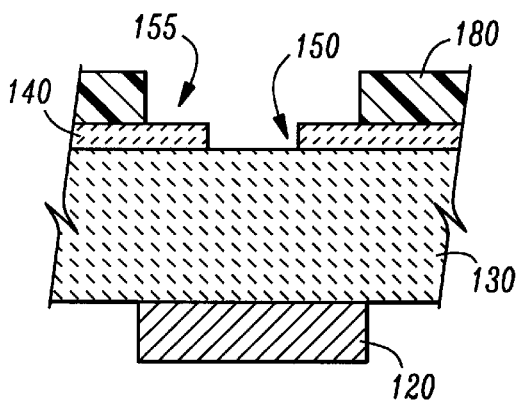

Referring to FIG. 1C, the masking layer 180 is again exposed and patterned to define a second cavity 155 of sufficient width that subsequently defines a portion of a via that is later filled with a conductive material that contacts the plug portion of the interconnect structure (hereinafter referred to as "runner portion"). This runner portion is typically filled with the same conductive material as the plug portion and forms the conducting or wiring part of the interconnect. Since there is no penetration of the first dielectric layer 130 at this stage, the topography with thinner second dielectric layer 140 is less severe than that found in conventional processes, which may yield an improved depth of focus and a reduction in the photoresist scumming problems normally experienced during patterning. The conventional process of etching into the first dielectric layer 130 results in a higher aspect ratio, making the patterning process more difficult and also provides a topography that promotes photoresist scumming.

Figure 1D:
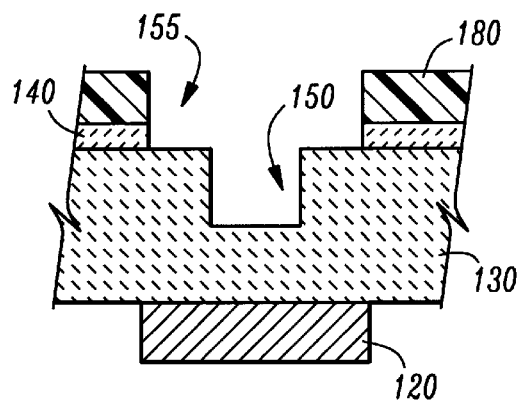
Figure 1E:
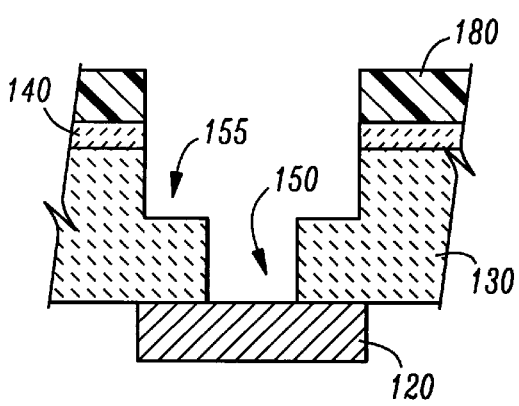

Refer now to FIG. 1D. A second etch-back removes regions of the first and second dielectric layers 130, 140 not covered by the masking layer 180. The second dielectric layer 140, with its slower etch rate acts, in effect, as a guide for etching the plug portion of the interconnect. The first cavity 150 is thereby formed in the first dielectric layer 130. Further etching removes additional regions of the first dielectric layer 130, thereby forming the second cavity 155 (see FIG. 1E), which forms the runner portion of the interconnect. Since the first dielectric layer 130 is etched at a faster rate than the second dielectric layer 140, the second etch-back, in effect, amplifies a thinner second dielectric step height into a thicker first dielectric step height. The depth of the first and second cavities 150, 155 in the first dielectric layer 130 may, therefore, be varied by changing the thickness of the second dielectric layer 140. Thus, more control is thereby achieved since the thickness of the sacrificial second dielectric layer 140 less than that of the first dielectric layer 150. In general, the thickness of the first dielectric layer 150 can not be changed as a fixed design parameter to control an RC delay or an over a planarization of the device.

Figure 1F:
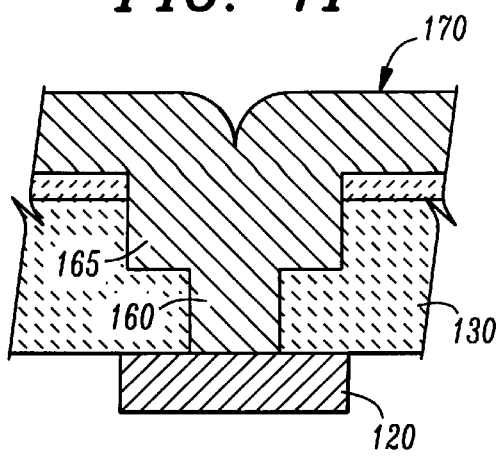
Figure 1G:
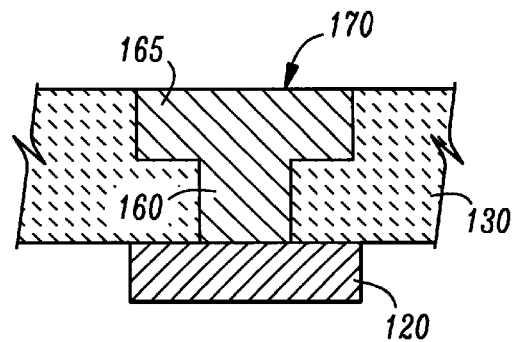

Turning now to FIG. 1F, a conductive substance is then deposited by conventional processes in the first and second cavities 150, 155 to form an interconnect 170, consisting of a plug portion 160 that contacts a particular location on the conductive layer 120 and a runner portion 165 that extends to other portions of the semiconductor device 100. The interconnect 170 may, in one embodiment of the present invention, be proximate to the conductive layer 120. In an advantageous embodiment, however, the conductive layer may be a metal. Those skilled in the art will realize, however, that the use of any conductive substance is within the broad scope of the present invention. Following the deposition of the conductive material, a conventional planar etch process removes the excess conductive substance and the sacrificial second dielectric layer 140 from the semiconductor structure 100, as illustrated in FIG. 1G.

Figure 2A:
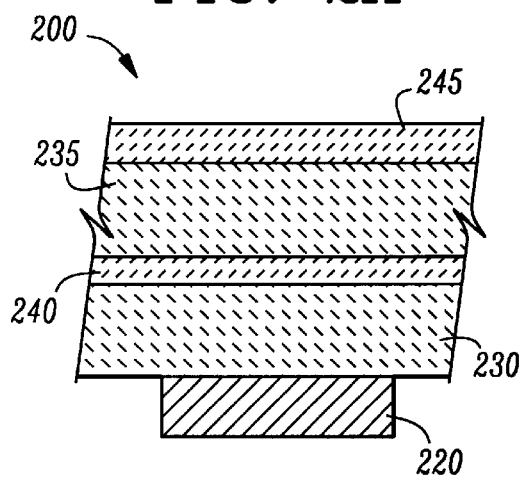
FIGS. 2A through 2H illustrate exemplary, schematic, cross-sectional views of an interconnect scheme, which are not drawn to scale, used in constructing another semiconductor device according to the principles of the present invention.

Turning now to FIGS. 2A through 2H, illustrated is a schematic, cross-sectional view of an interconnect scheme used in constructing a semiconductor device or structure 200 according to the principles of the present invention. Referring in particular to FIG. 2A, the semiconductor structure 200 consists of a silicon-based substrate or a previous interconnection level of a multi-level interconnection scheme having a conductive layer 220 located therein. While the substrate illustrated in this advantageous embodiment is composed of silicon, those skilled in the art will realize that the substrate may be composed of any semiconductor material. The following dielectric layers are then formed over at least a portion of the semiconductor structure 200. Initially, a first dielectric layer 230, with a first etch rate, is formed over the surface of the semiconductor structure 200. A second dielectric layer 240, with a second etch rate, is then deposited over the first dielectric layer 230 by conventional processes. Next, a third dielectric layer 235 is deposited by conventional processes over the second dielectric layer 240. The third dielectric layer 235 in an advantageous embodiment has the same etch rate (i.e., the first etch rate) as the first dielectric layer 230. However in some embodiments, the third dielectric layer may have an etch rate that is different from the etch rate of the first dielectric layer 230. Finally, a fourth dielectric layer 245 is deposited by conventional processes over the third dielectric layer 235. The fourth dielectric layer 245 in an advantageous embodiment has the same etch rate (i.e., the second etch rate) as the second dielectric layer 240. However in some embodiments, the fourth dielectric layer may have an etch rate that is different from the etch rate of the second dielectric layer 240.

In one advantageous embodiment of the present invention, the first and third dielectric layers 230, 235 are composed of silicon oxide and the second and fourth dielectric layers 240, 245 are composed of silicon nitride. In another advantageous embodiment of the present invention, the second etch rate is at least three times slower than the first etch rate. In a further advantageous embodiment of the present invention, the second etch rate is at least ten times slower than the first etch rate. Those skilled in the art will realize, however, the use of any dielectric materials for the first, second, third and fourth layers 230, 240, 235, 245, in which the first etch rate exceeds the second etch rate, is within the broad scope of the present invention.

Figure 2B:
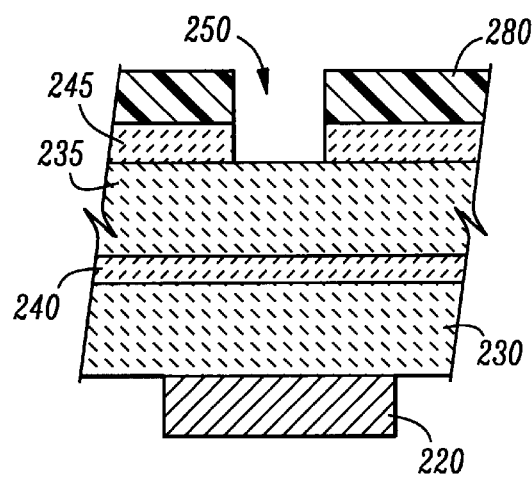

Referring to FIG. 2B, a first etch is substantially similar to that previously discussed with respect to FIGS. 1A through 1G. A masking layer 280, such as a photoresist layer, is conventionally deposited over the fourth dielectric layer 245, patterned by exposure through a mask pattern (not shown) and developed. Regions of the fourth dielectric layer 245 not covered by the masking layer 280 are then etched-back, resulting in a first cavity 250 of sufficient width wherein a conductive substance may be subsequently deposited by conventional processes to from a plug portion of an interconnect. The first cavity 250 is thereby formed, which has the same attendant advantages discussed above regarding FIG. 1B.

Figure 2C:
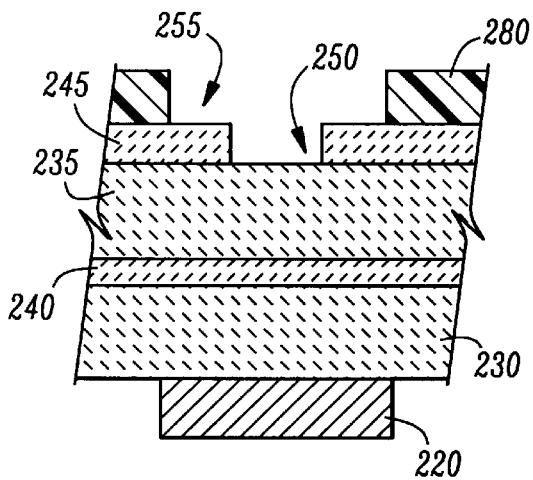

Referring to FIG. 2C, the masking layer 280 is again exposed and patterned in a second etch to define a second cavity 250 of sufficient width wherein a conductive substance may subsequently be deposited to form a runner portion of the interconnect. Again, the topography formed by this second etch has the same attendant advantages as discussed above regarding FIG. 1C.

Figure 2D:
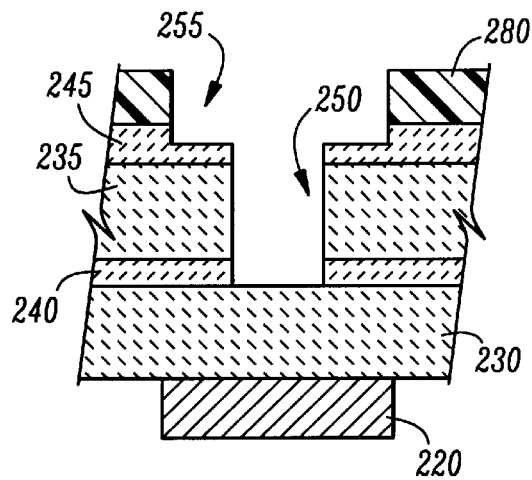

Refer now to FIG. 2D. A second etch-back now removes regions of the third and fourth dielectric layers 235, 245 not covered by the masking layer 280. The fourth dielectric layer 245, with its slower etch rate, acts as a guide for the third dielectric layer 235.

Figure 2E:
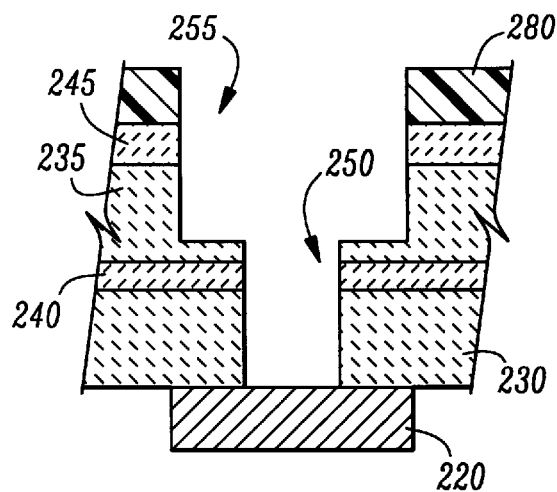
Figure 2F:
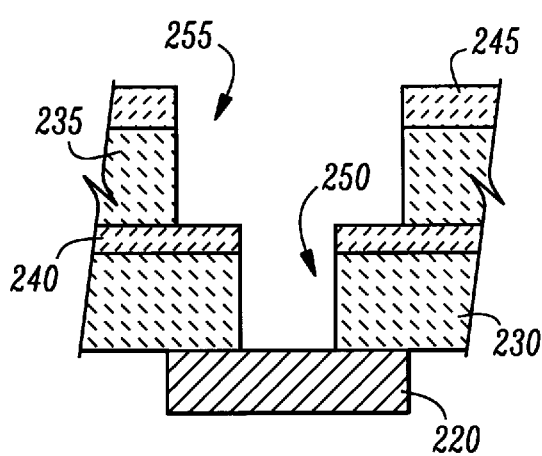

Referring now to FIG. 2E, further etching removes regions of the first and second dielectric layers 230, 240, forming the first cavity 250. Regions of the third and fourth dielectric 235, 245 not covered by the masking layer 280 are also removed, forming a second cavity 255 for the runner portion. Since the fourth dielectric layer 245 has a slower etch rate than the third dielectric layer 235, the depth of the second cavity 255 for the runner portion can be controlled by varying the thickness of the fourth dielectric layer 245. Also, since the second dielectric layer 240 has a slower etch rate than the first and third dielectric layers 230, 235, the second dielectric layer 240 may act as an etch stop, allowing the retention of a proper aspect ratio of the first cavity 250 relative to the second cavity 255 (see FIG. 2F).

Figure 2G:
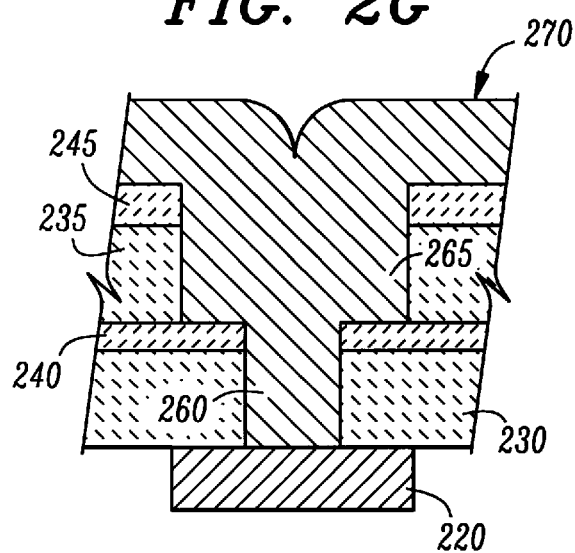
Figure 2H:
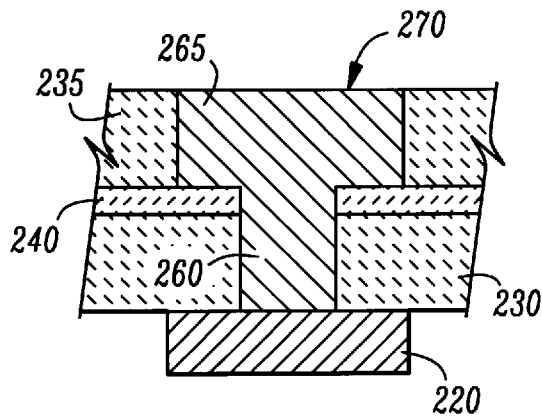

Referring to FIG. 2G, a conductive substance is then deposited by conventional processes in the first and second cavities 250, 255 to form an interconnect 270, consisting of a plugs portion 260 that contact a particular location on the conductive layer 220 and a runner portion 265 that extend to other portions of the semiconductor device 200. Following the deposition of the conductive layer 220, a planar etch is used to remove the excess conductive substance as illustrated in FIG. 2H.

Figure 3A:
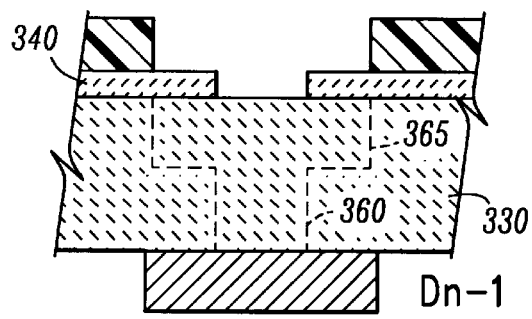
FIGS. 3A and 3B illustrate exemplary, schematic, cross-sectional views of two embodiments of a profile tuner, which are not drawn to scale, used in constructing a semiconductor device according to the principles of the present invention.
Figure 3B:
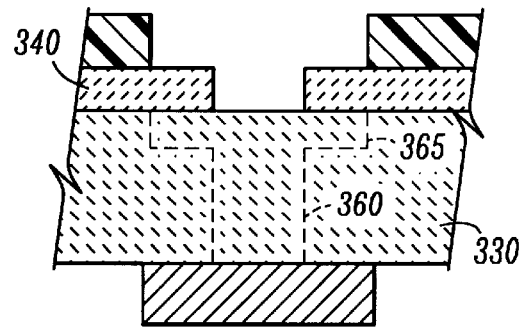

The following advantages are provided when dielectric layers with different etch rates are used. Turning to FIGS. 3A and 3B, illustrated is a schematic, cross-sectional view of two embodiments of a profile tuner used in constructing a semiconductor device according to the principles of the present invention. Both embodiments include a second dielectric layer 340 deposited over a first dielectric layer 330. The second dielectric layer 340 acts as a profile tuner to control an aspect ratio (a thickness of a runner portion 365 relative to a plug portion 360) of an interconnect. Prior to the present invention, the aspect ratio was determined by an initial etched depth of a first cavity for a plug portion 360. Since the depth of the cavity is a function of the thickness of the second dielectric layer 340 under the fixed etch selectivity to the first dielectric layer 330, however, the second dielectric layer 340 may be made thicker or thinner as necessary to produce the proper aspect ratio. The thickness of the dielectric layer 340 may be accurately and repeatably controlled, thus resulting in greater control of the aspect ratio. FIG. 3A, in particular, illustrates the use of a thinner second dielectric layer 340, resulting in the thicker runner portion 365 relative to the plug portion 360. FIG. 3B illustrates the use of a thicker second dielectric layer 340, producing the relatively thinner runner portion 365. A thicker runner portion 365 can carry more current, but in this particular embodiment, it is excessivley closer to any conductive region, resulting in greater cross-talk or capacitive interference. A thinner runner portion, on the other hand, has greater resistance, resulting in lower current driving, capability and reduced transmission speeds. Controlling the aspect ratio of the interconnect allows the runner portion to be appropriately sized in light of these issues.

Figure 4A:
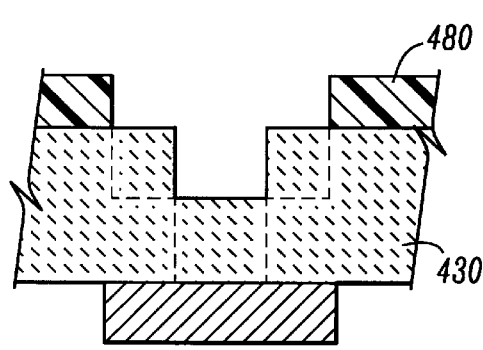
FIGS. 4A and 4B illustrate exemplary, schematic, cross-sectional views, which are not drawn to scale, showing the effect of a masking layer in constructing a semiconductor device according to the principles of the present invention.
Figure 4B:
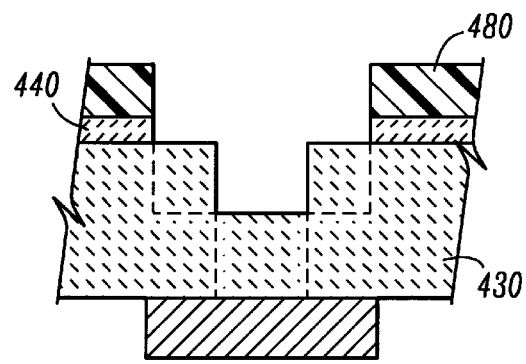

Turning now to FIGS. 4A and 4B, FIG. 4B illustrates a schematic, cross-sectional view showing the effect of a masking layer in constructing a semiconductor device according to the principles of the present invention. FIG. 4A illustrates a schematic, cross-sectional view of a prior art interconnect scheme used in constructing semiconductor devices. Both semiconductor devices include a dielectric layer 430, patterned by a masking layer 480, such as a photoresist layer. The embodiment of the present invention illustrated in FIG. 4B additionally includes a second dielectric layer 440, with a slower etch rate. The highly selective second dielectric layer 440, to the underneath first dielectric layer 430, may act as a secondary mask layer underneath the patterned masking layer 480. The use of the second dielectric layer 440 allows a thickness of the masking layer 480 to be reduced, thereby allowing better resolution during photoresist patterning.

Figure 5A:
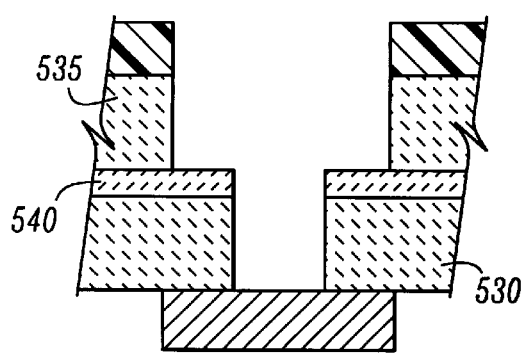
FIGS. 5A and 5B illustrate exemplary, schematic, cross-sectional views, which are not drawn to scale, showing the effect of an overetch control layer in constructing a semiconductor device according to the principles of the present invention.
Figure 5B:
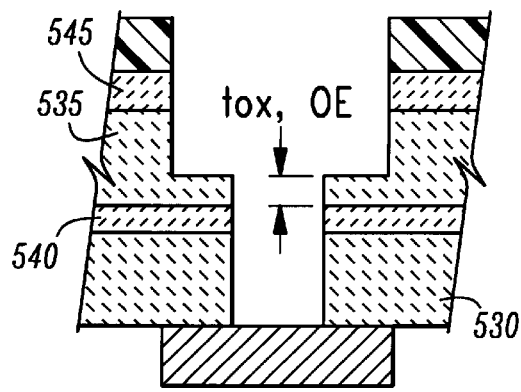

Turning finally to FIGS. 5A and 5B, FIG. 5B illustrates a schematic, cross-sectional view showing the effect of an overetch control layer in constructing a semiconductor device according to the principles of the present invention. FIG. 5A illustrates a schematic, cross-sectional view of a prior art interconnect scheme used in constructing semiconductor devices. Both semiconductor devices include a first, second, and third dielectric layers 530,540,535. The embodiment of the present invention illustrated in FIG. 5B additionally includes a fourth dielectric layer 545 with a slower etch rate than that of the third dielectric layer 535. Since the fourth dielectric layer 545 may be deposited in controlled thicknesses, the fourth dielectric layer 545 may thus be used as an overetch margin control layer to control the depth of a cavity of a runner portion of an interconnect. The thickness of the fourth dielectric layer 545 and the overetch margin may be mathematically determined from the following equations:

$$tDn,4crit=(ERnit/ERox)tDn,3+tDn,2$$

$$tox,OE=(ERox/ERnit)(tDn,4-tDn,4crit)$$

wherein:

tDn,4crit=the critical thickness of the fourth dielectric layer 545

ERnit=etch rate of the second and fourth dielectric layers 540,545

ERox=etch rate of the first and third dielectric layers 530,535 tDn,3=the thickness of the third dielectric layer 535 tDn,2=the thickness of the second dielectric layer 540 tox,OE=the thickness of the overetch margin, and tDn,4=the thickness of the fourth dielectric layer 545

The foregoing has outlined, rather broadly, preferred and alternative features of the present invention so that those skilled in the art may better understand the detailed description of the invention as stated herein. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

What is claimed is:

1. A method of creating an interconnect cavity extending to a previous interconnection level or a substrate containing a conductive layer formed in a first dielectric layer having a first etch rate, said method comprising:

forming a second dielectric layer on said first dielectric layer, said second dielectric layer having a second etch rate slower than said first etch rate;

forming a first patterned masking layer on said second dielectric layer;

etching said second dielectric layer through said first masking layer to form an exposed portion of said second dielectric layer;

patterning said first patterned masking layer a second time to form a second masking layer with an opening larger than said first masking layer;

etching said first dielectric layer and second dielectric layer through said second patterned masking layer until said exposed portion is consumed to form a trench in said first dielectric layer; and etching the first dielectric layer such that the trench is extended to contact said previous interconnection level or said substrate.

2. The method as recited in claim 1 wherein said substrate is silicon-based.

3. The method as recited in claim 1 wherein said first dielectric layer is an oxide.

4. The method as recited in claim 1 wherein said first dielectric layer comprises silicon oxide.

5. The method as recited in claim 1 wherein said second dielectric layer is a nitride.

6. The method as recited in claim 1 wherein said second dielectric layer comprises silicon nitride.

7. The method as recited in claim 1 wherein forming and patterning said first masking layer includes forming and patterning a photoresist layer formed over said second dielectric layer to locate said cavity relative to said substrate.

8. The method as recited in claim 1 wherein said second etch rate is at least three times slower than said first etch rate.

9. The method as recited in claim 1 wherein further comprising depositing a conductive substance into said cavity to create said interconnect.

10. The method as recited in claim 1 wherein forming a second dielectric layer comprises varying a thickness of said second dielectric layer to vary a depth of said cavity.

11. A method of creating an interconnect cavity extending to a previous interconnection level or a silicon-based substrate containing a conductive layer formed in a first oxide layer having a first etch rate, said method comprising:

forming a first nitride layer on said first oxide layer, said first nitride layer having a second etch rate slower than said first etch rate;

forming a first patterned masking layer on said first nitride layer;

etching said first nitride layer through said first patterned masking layer to form an exposed portion of said first oxide layer;

patterning said first patterned masking layer a second time to form a second patterned masking layer with an opening larger than the first patterned masking layer;

etching said first oxide layer and said first nitride layer through said second patterned masking layer until said exposed portion is consumed to form a trench in said first oxide layer; and etching said first oxide layer until said trench contacts said previous interconnection level or said substrate.

12. The method as recited in claim 11 further comprising:

forming a second oxide layer over said first nitride layer; and forming a second nitride layer over said second oxide layer, prior to forming a first patterned masking layer and forming a first patterned masking layer includes forming said first patterned masking layer on said second nitride layer.

13. The method as recited in claim 11 wherein said oxide layer comprises silicon oxide.

14. The method as recited in claim 11 wherein said nitride layer comprises silicon nitride.

15. The method as recited in claim 11 wherein said second etch rate is at least three times slower than said first etch rate.

16. The method as recited in claim 15 wherein said second etch rate is at least ten times slower than said first etch rate.

17. The method as recited in claim 11 wherein forming a first patterned masking layer includes depositing a photoresist layer over said first nitride layer and patterning said photoresist layer to locate said cavity relative to said substrate.

18. The method as recited in claim 11 wherein a depth of said cavity is about four times a thickness of said nitride layer.

19. The method as recited in claim 11 further comprising depositing metal into said cavity to create said interconnect.

20. The method as recited in claim 11 wherein forming a first nitride layer comprises varying a thickness of said first nitride layer to vary a depth of said cavity.

* * * * *